United States Patent
Nelson et al.

(10) Patent No.: US 7,746,058 B2
(45) Date of Patent: Jun. 29, 2010

(54) SEQUENTIAL EQUIVALENT—TIME SAMPLING WITH AN ASYNCHRONOUS REFERENCE CLOCK

(75) Inventors: Michael A. Nelson, Lake Oswego, OR (US); Pavel R. Zivny, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 176 days.

(21) Appl. No.: 12/053,473

(22) Filed: Mar. 21, 2008

(65) Prior Publication Data

US 2009/0237072 A1 Sep. 24, 2009

(51) Int. Cl.
G01R 13/20 (2006.01)
G01R 13/22 (2006.01)
G01R 13/34 (2006.01)
G01R 13/14 (2006.01)

(52) U.S. Cl. .................. 324/121 R; 324/76.24

(58) Field of Classification Search .................. None
See application file for complete search history.

(56) References Cited

U.S. PATENT DOCUMENTS

| | | | |
|---|---|---|---|
| 6,564,160 B2 | 5/2003 | Jungerman | |
| 6,573,761 B1* | 6/2003 | MacDonald et al. | 327/91 |
| 6,650,101 B2* | 11/2003 | MacDonald et al. | 324/76.24 |
| 6,753,677 B1 | 6/2004 | Weller | |
| 6,865,496 B2* | 3/2005 | Camnitz et al. | 702/69 |
| 2003/0081667 A1 | 5/2003 | Camnitz | |
| 2007/0291885 A1 | 12/2007 | Viss | |

* cited by examiner

*Primary Examiner*—Ha Tran T Nguyen
*Assistant Examiner*—Roberto Velez
(74) *Attorney, Agent, or Firm*—William K. Bucher

(57) ABSTRACT

A sequential equivalent-time sampling oscilloscope simultaneously acquires samples of a signal-under-test and a reference clock that is asynchronous with the signal-under-test. The oscilloscope converts the samples of the reference clock into timestamps and uses the timestamps to compensate for the jitter of the oscilloscope and to indicate the absolute jitter of the signal-under-test.

9 Claims, 8 Drawing Sheets

US 7,746,058 B2

SEQUENTIAL EQUIVALENT—TIME SAMPLING WITH AN ASYNCHRONOUS REFERENCE CLOCK

FIELD OF THE INVENTION

The present invention relates generally to oscilloscopes, and more specifically to sequential equivalent-time sampling oscilloscopes.

BACKGROUND OF THE INVENTION

Sequential equivalent-time sampling oscilloscopes such as the DSA8200 Digital Serial Analyzer available from Tektronix, Inc. of Beaverton, Oreg. and the 86100C Infiniium DCA-J available from Agilent, Inc. of Santa Clara, Calif. are used to measure time-domain waveforms of high-frequency signals. These oscilloscopes consist of a mainframe into which various models of sampling modules are installed.

The sampling circuits used in the sampling modules have high instantaneous measurement bandwidths but they must sample at low sampling frequencies. For example, a Tektronix 80E06 sampling module provides 70 GHz of bandwidth but the DSA8200's maximum sampling rate is 200 kHz. Similarly, an Agilent 8611B provides 65 GHz of bandwidth but the 86100C's maximum sampling rate is 40 kHz. Accordingly, in typical usage the waveforms acquired by these oscilloscopes are aliased.

To acquire one sample, the oscilloscope arms a trigger circuit and waits for an edge of a user-supplied trigger signal. Once a trigger edge is detected, the oscilloscope creates a precision time delay by running a delay generation circuit which consists of a startable oscillator, a counter, and a vernier. After the precision time delay elapses, the oscilloscope strobes each sampling circuit installed into the mainframe and in response each sampling circuit produces a sampled analog value. The sampled analog values are digitized by analog-to-digital converters and then the digitized values are passed to a controller for processing, storage, and display. The oscilloscope then waits up to $1/(200\ kHz)=5\ \mu s$ or $1/(40\ kHz)=25\ \mu s$ as the case may be to provide time to process the samples and prepare for the next acquisition. The oscilloscope then re-arms the trigger circuit and waits for the next trigger edge.

To acquire a complete waveform, the oscilloscope performs the above steps multiple times as the delay generation circuit is sequentially stepped through a range of delays. For example, to acquire 1,000 samples covering a 1 ns time-span, the sample spacing thus being 1 ps, the oscilloscope performs the above steps 1,000 times as the delay generation circuit is stepped through a 1 ns time span in 1 ps increments. The resulting samples represent the signal-under-test at "equivalent times" of 1 ps, 2 ps, 3 ps ... 1,000 ps relative to the trigger signal. If the signal-under-test is repetitive and the trigger signal is synchronous with the signal-under-test, then the waveform appears stationary on the display-an effect referred to as "the stroboscopic effect."

One difficulty with these oscilloscopes is that propagation delay imperfections in the trigger circuit, the delay generation circuit, and the sampling circuit may cause the oscilloscope to acquire samples slightly earlier or later than desired, thus giving the appearance of jitter in the displayed waveform and spoiling the waveform fidelity. See J. B. Rettig and L. Dobos, "Picosecond time interval measurements," *IEEE Transactions on Instrumentation and Measurement*, vol. 44, no. 2, pp. 284-287, April, 1995 for a detailed discussion of oscilloscope jitter. Both the DSA8200 and the 86100C have approximately 700 fs RMS of intrinsic random Gaussian jitter. Sampling modules such as the Tektronix 82A04 Phase Reference Module and the Agilent 86107A Precision Timebase Reference Module provide for the post-processing compensation of oscilloscope jitter by simultaneously sampling quadratures of a reference clock that is synchronous with the signal-under-test, transforming those quadrature samples into phase values, determining the timing error of the oscilloscope from those phase values, and then adjusting the horizontal placement of the samples of the signal-under-test to compensate for that timing error. See U.S. Pat. No. 6,564,160 to Jungerman et al. for a discussion of the Agilent 86107A. However, in many cases a synchronous reference clock is not available and thus this approach cannot be used.

Another difficulty with these oscilloscopes is that the oscilloscope cannot provide information about the "absolute" jitter of the signal-under-test, that is, jitter relative to a spectrally pure time reference. In other words, if both the trigger signal and the signal-under-test jitter in the same fashion, then the oscilloscope display nonetheless appears stationary and gives no indication of that jitter to the user because the oscilloscope only acquires samples at times relative the trigger signal. Knowledge of the absolute jitter of the signal-under-test is useful because it is specified in many serial data standards.

What is desired is a sequential equivalent-time oscilloscope having reduced jitter without the use of a reference clock that is synchronous to a signal-under-test. It is further desired that the oscilloscope indicate the absolute jitter of the signal-under-test.

SUMMARY OF THE INVENTION

Accordingly, in the present invention a sequential equivalent-time sampling oscilloscope simultaneously acquires samples of a signal-under-test and a reference clock that is asynchronous with the signal-under-test. The oscilloscope converts the samples of the reference clock into timestamps and uses the timestamps to compensate for the jitter of the oscilloscope and to indicate the absolute jitter of the signal-under-test.

The objects, advantages and other novel features of the present invention are apparent from the following detailed description when read in conjunction with the appended claims and attached drawings.

DETAILED DESCRIPTION OF THE INVENTION

Figure 1:
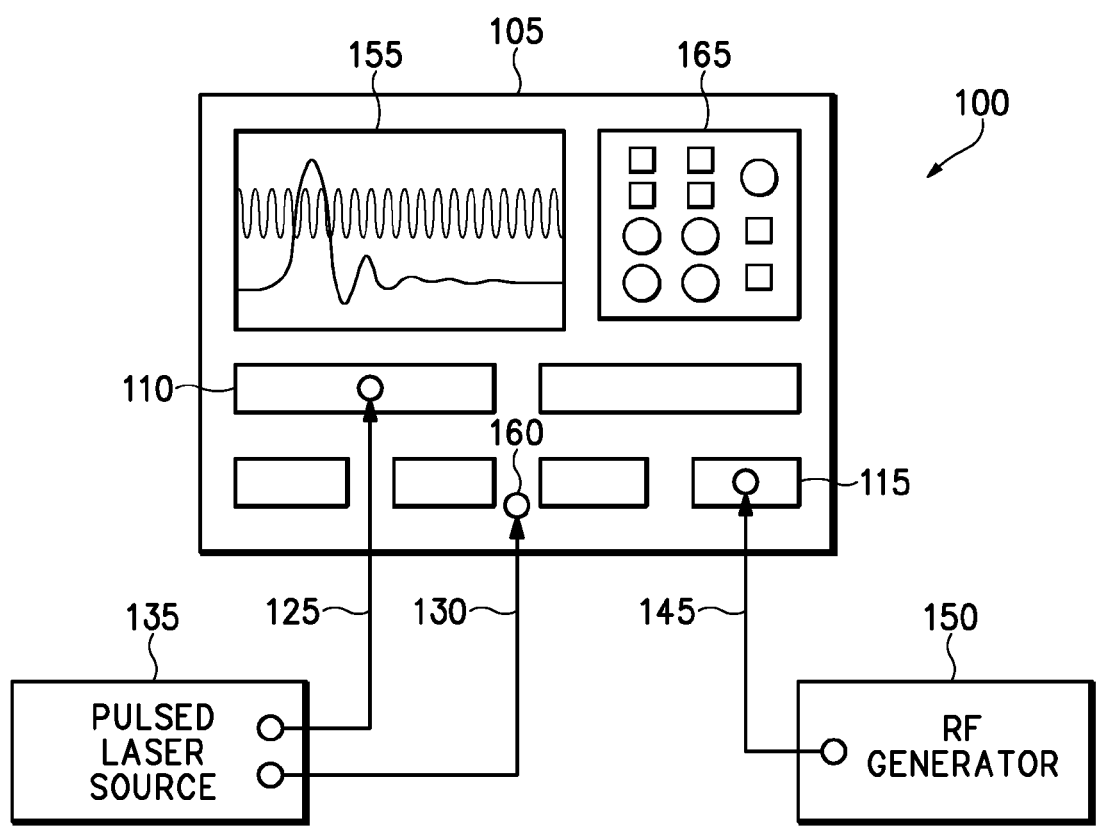
FIG. 1 illustrates an arrangement of test and measurement equipment suitable for implementing an acquisition method in accordance with the present invention.

FIG. 1 depicts an arrangement of test and measurement equipment in accordance with the present invention 100. A DSA8200 sequential equivalent-time sampling oscilloscope 105 is configured with an 80C10 Optical Sampling Module 110 and an 82A04 Phase Reference Module 115. A pulsed laser source 135 such as an FPL-01CAF mode-locked Erbium Doped Fiber Amplifier (EDFA) available from Calmar Optcom Inc. of Sunnyvale, Calif. provides a signal-under-test 125, an optical impulse signal, to the optical sampling module and a trigger signal 130 to the oscilloscope's trigger input 160. An RF generator 150 such as a MG3690B RF/microwave signal generator available from Anritsu Corporation of Atsugi, Japan provides a reference clock 145 to the Phase Reference Module. The RF generator and the pulsed laser source are not phase-locked, thus the reference clock is asynchronous with the signal-under-test.

The optical impulse signal is a series of narrow optical impulses at a frequency of approximately 10 MHz, with the exact frequency being dependent upon the length of Erbium fiber used in the amplifier, the amplifier bias settings, temperature, etc. The trigger signal is an electrical replica of the optical impulse signal used for triggering test and measurement equipment. Other types of signal-under-test may also be measured with the present invention, e.g., serial data patterns.

The reference clock is a 10 GHz sine-wave. The sine-wave is spectrally pure, meaning that it has low phase-noise, or equivalently, that it has low jitter. The center frequency of the reference clock is not critical for reasons discussed below. Although in this example the reference clock comes from a source external to the oscilloscope, the reference clock may also come from within the oscilloscope itself.

Figure 2:
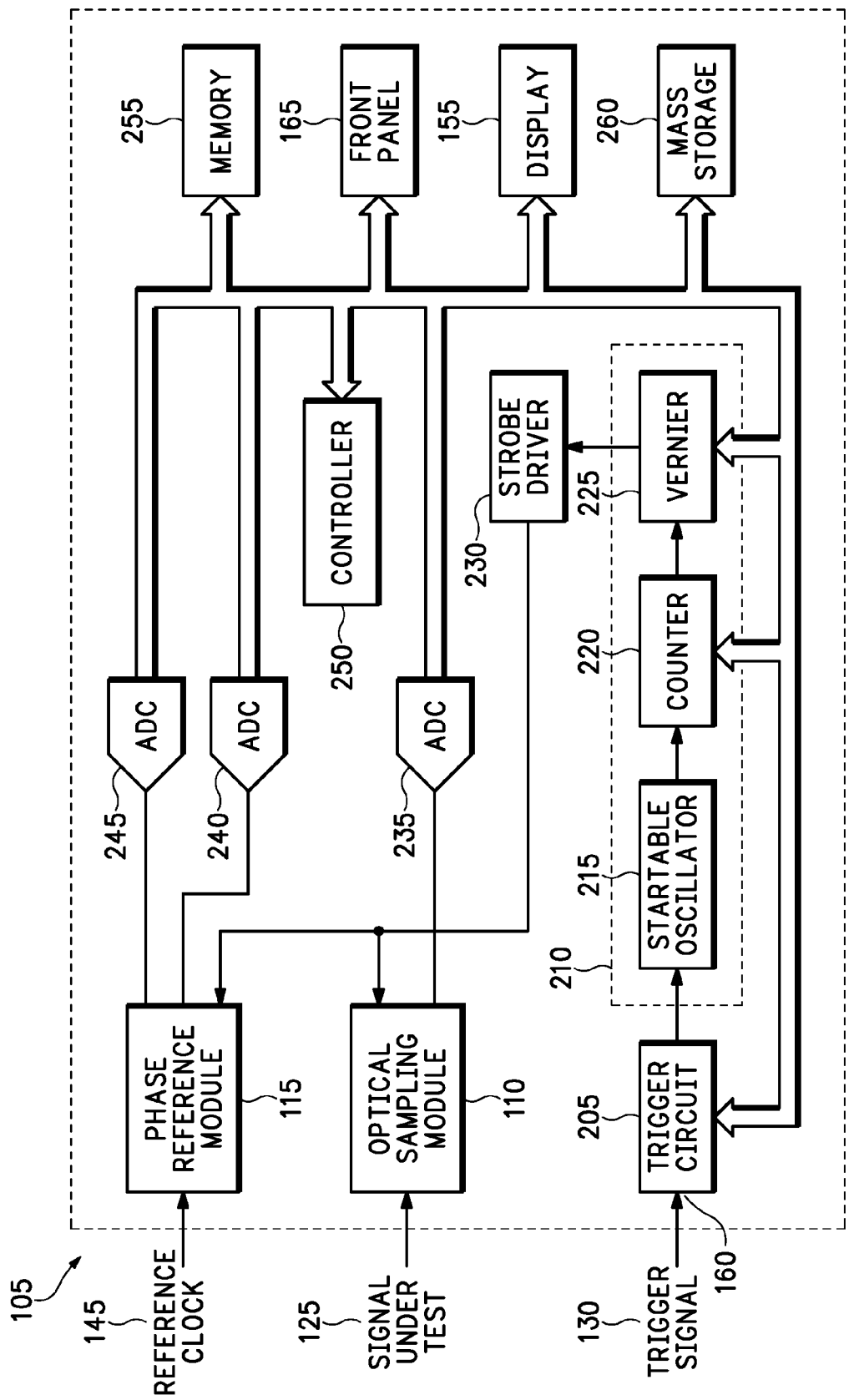
FIG. 2 depicts a simplified block diagram of the oscilloscope in FIG. 1.

For the purposes of illustration, the oscilloscope is set to acquire a horizontal span of 100 ps with 4,000 samples, thus the sample spacing is 25 fs. The samples are acquired as follows: Referring to FIG. 2, trigger circuit 205 opens and waits for an edge of the trigger signal. Once a trigger edge is detected, the oscilloscope runs delay generation circuit 210 which consists of startable oscillator 215, counter 220, and vernier 225, and then strobe driver 230 strobes sampling modules 110 and 115 to acquire samples of the signal-under-test and the reference clock. The Phase Reference Module internally (not shown) splits the reference clock into two replicas and samples them at quadrature, or 90° apart, thus producing one pair of sampled analog values per strobe. Analog-to-digital converters 235, 240, and 245 digitize the sampled analog values, and the digitized values are passed to a controller 250 for processing, storage in memory 255 or mass storage 260, and display on display 155. The controller may be a general purpose processor with software, a microcontroller, an ASIC, an FPGA, etc. This process is repeated 4,000 times as the delay generation circuit is stepped in 25 fs increments to acquire the complete record.

The trigger signal is divided by 100 by a divider (not shown) before being provided to the oscilloscope. Thus, the trigger signal received by the oscilloscope is ~10 MHz÷100=~100 kHz, or one trigger edge every ~10 μs, which is slower than the oscilloscope's maximum sample rate of 200 kHz. In this manner, because the oscilloscope can acquire a sample and re-arm in less than 5 μs, the oscilloscope is ready to sample with the arrival of every divided trigger edge. Thus, the precise sampling frequency is dictated by the pulsed laser source. The significance of this is explained below.

Figure 3:
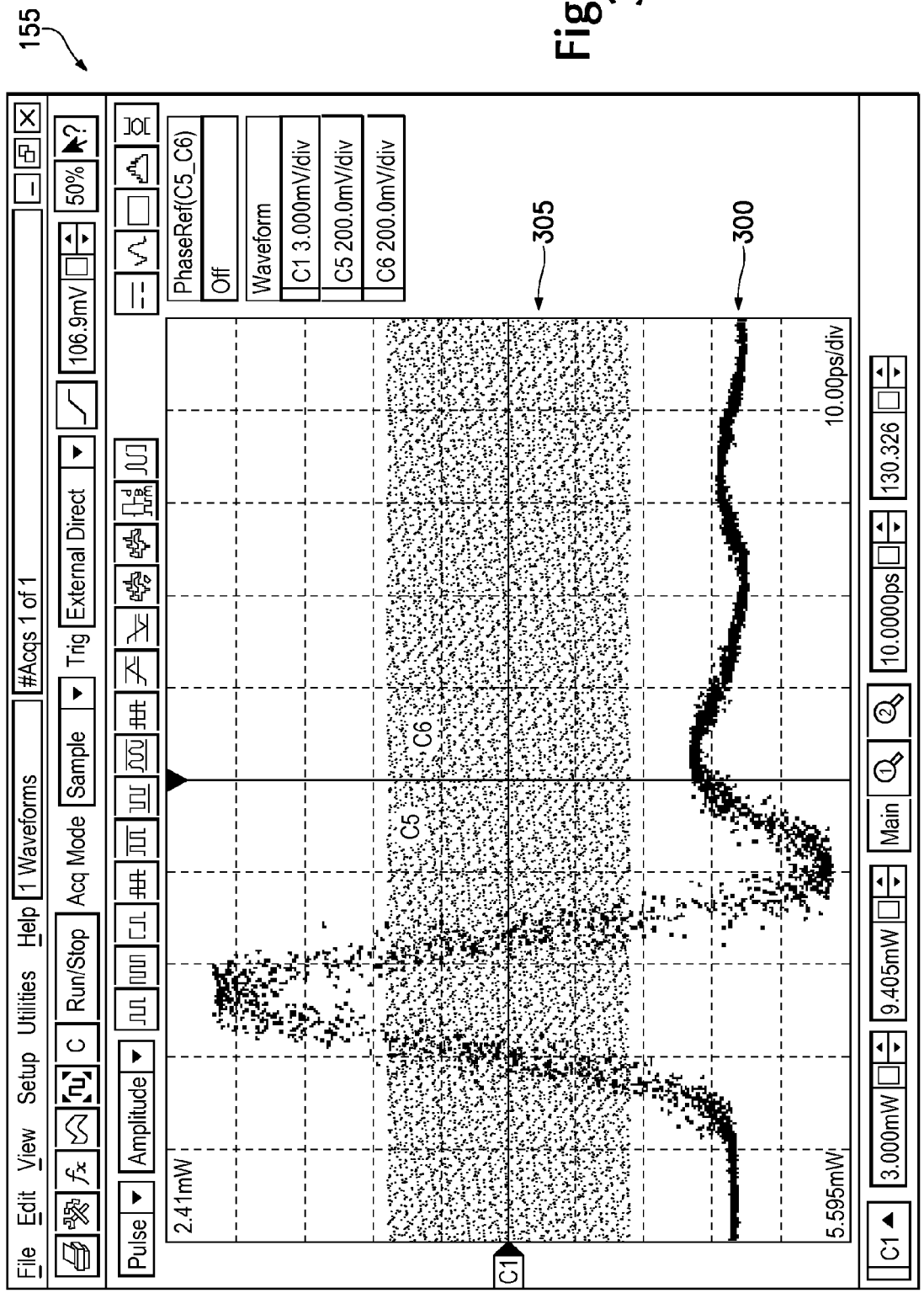
FIG. 3 depicts the display of the oscilloscope in FIG. 1.

FIG. 3 depicts the display of the oscilloscope that results from the acquisition process described above. The waveform of the optical impulse signal 300 appears smeared out due to the oscilloscope's 700 fs RMS jitter. The displayed waveforms of the quadratures of the reference clock 305 are not stationary because the reference clock is not synchronous with the trigger signal. The waveforms of the quadratures are not normally shown on the display as their purpose is solely to compensate for oscilloscope jitter, but they are shown here for the purpose of illustration.

Figure 4:
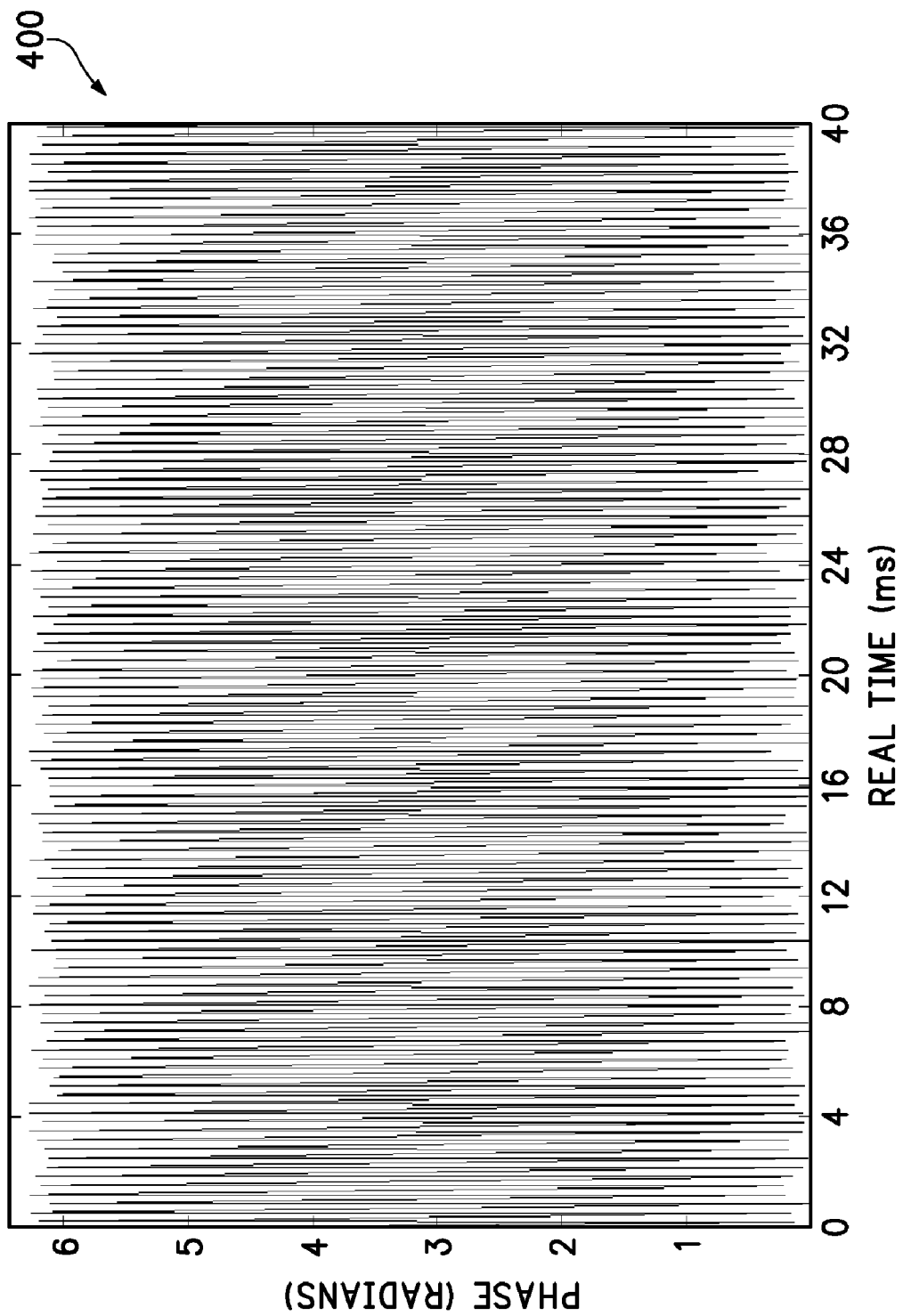
FIG. 4 illustrates sampled phases of a reference clock in accordance with the present invention.

Referring to FIG. 4, the pairs of samples of the quadratures of the reference clock may be converted into phases 400 with a function such as the arctangent function. Despite the fact that the reference clock is asynchronous with the trigger signal, FIG. 4 reveals a clear pattern in the phase progression. This indicates that during the 4,000×10 μs=40 ms interval in which the samples were acquired, the frequencies of the trigger signal and the reference clock were stable relative to one another, or in other words, the signals had little phase-noise relative to one another. This is a reasonable observation because modern instrumentation grade oscillators have on the order of 100 fs RMS jitter when integrated over 10 ms. Furthermore, the quadrature sampling "phase-detection" process has low intrinsic jitter. For example, if the sampling circuits each have 1 mV RMS vertical noise and the reference clock has 1 V peak-to-peak amplitude, then the expected jitter is the vertical noise of the samplers divided by the effective slew rate of the reference clock, or 1 mV RMS/(0.5 V×2π×10 GHz)≈32 fs RMS. Thus, the higher the frequency of the reference clock, the lower the intrinsic jitter. An estimate of the intrinsic jitter of this measurement is therefore the root-sum-of-squares combination of the jitter of the two oscillators, the jitter of the oscilloscope, and the jitter of the phase detection process, or $(100 \text{ fs}^2+100 \text{ fs}^2+700 \text{ fs}^2+32 \text{ fs}^2)^{1/2}$=~715 fs RMS.

The sampled phases may be viewed as precise measurements of each instant in time when the optical impulse signal was sampled. Although the exact frequency of the trigger signal is unknown, and thus the number of cycles of the reference clock that elapsed between each of the measured instants is also unknown, sample time deviations or "timestamps" may be calculated as follows: (1) unwrap the sampled phases into a phase ramp ("Phase unwrapping" converts phase values which are bounded 0-2π radians into a continuous ramp. For example, unwrapping the phase values 0, 0.25π, 0.5π . . . 1.75π, 0π, 0.25π radians results in 0, 0.25π, 0.5π . . . 1.75π, 2.0π, 2.25π radians.), (2) determine an ideal phase ramp from it by finding its best-fit straight line approximation in the least-squares-sense, and (3) take the difference between the sampled phases and the straight line approximation and scale by the period of the reference clock. Using this approach, the slope of the phase progression is arbitrary, and thus the reference clock is a useful time measurement device regardless of its center frequency.

Figure 5:
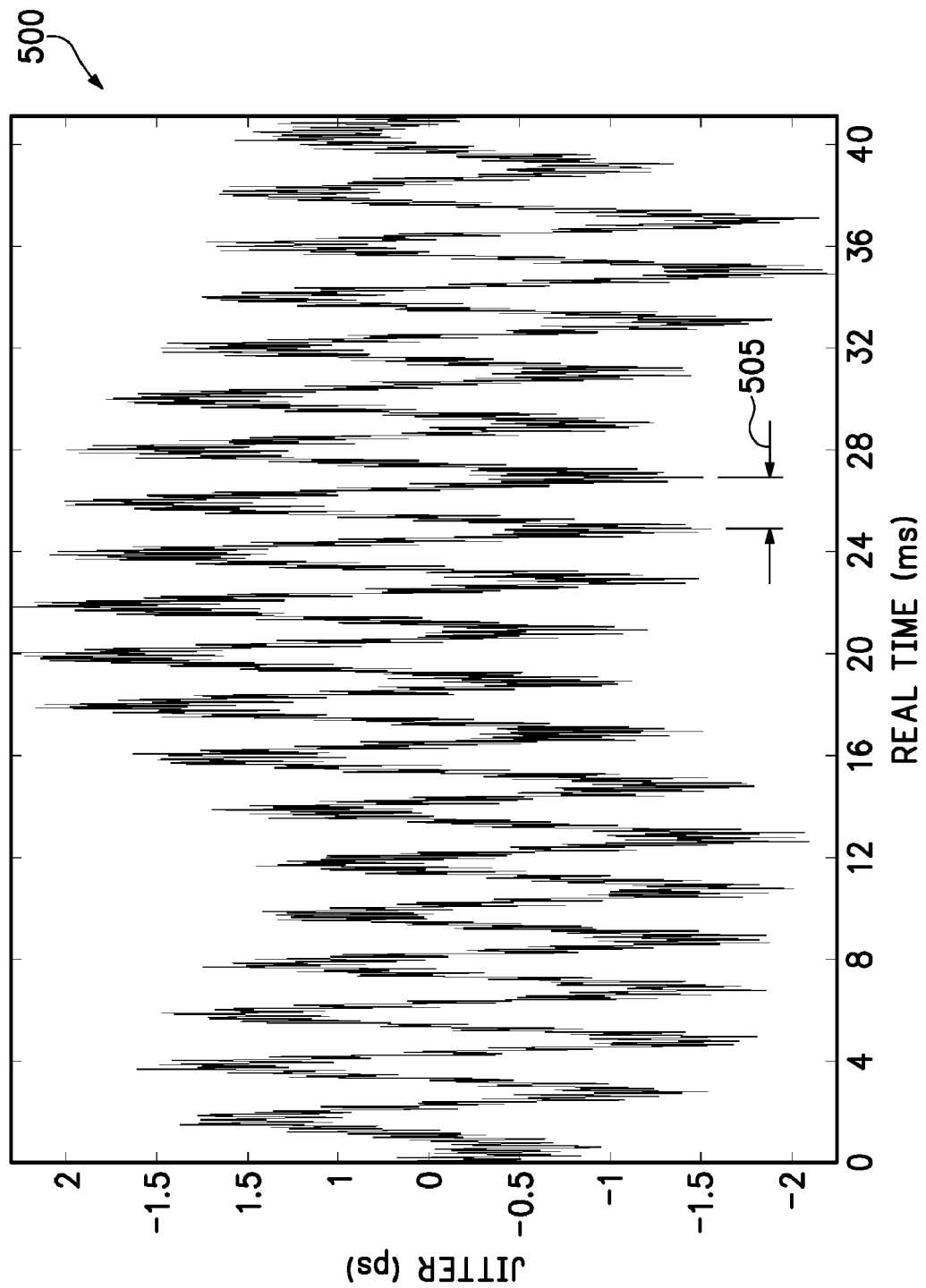
FIG. 5 illustrates the time-domain jitter of the signal-under-test in accordance with the present invention.
Figure 6:
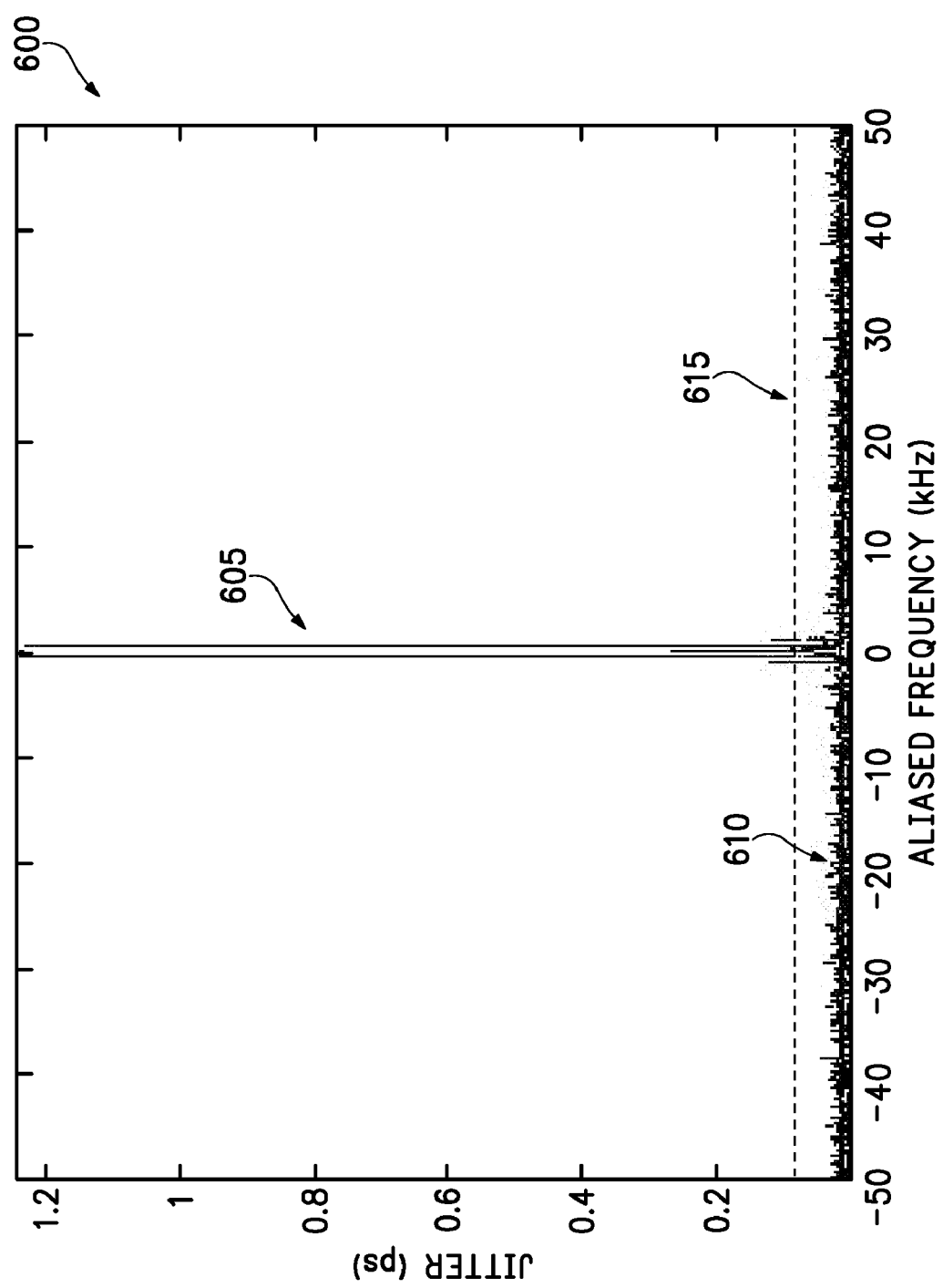
FIG. 6 illustrates the frequency-domain jitter spectrum of the signal-under-test in accordance with the present invention.

The timestamps represent the jitter of the signal-under-test relative to the spectrally pure reference clock, or in other words, the absolute jitter of the signal-under-test. FIG. 5 shows this jitter in the time-domain 500. This jitter may be Fourier transformed into a frequency domain jitter spectrum 600 as shown in FIG. 6. The oscillation 505 in FIG. 5 and equivalently the spurs 605 in FIG. 6 may be attributed to the optical impulse signal because both the reference clock and the oscilloscope are known to have only low levels of random Gaussian jitter. Thus, the present acquisition method reveals that the center frequency of the signal-under-test is oscillating, while the conventional sequential equivalent-time acquisition method is capable of providing no such information.

Figure 7:
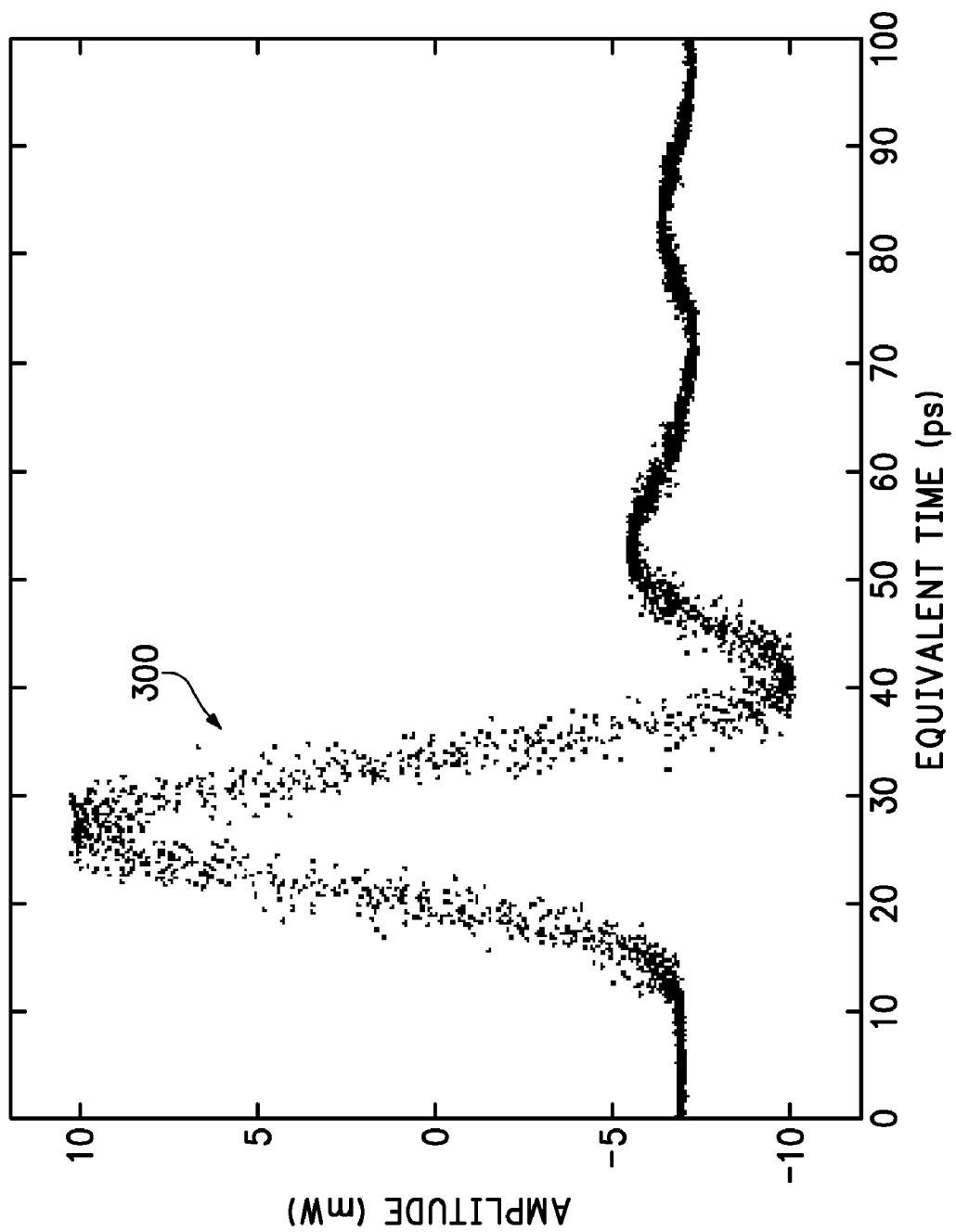
FIG. 7 illustrates a waveform of an optical impulse signal acquired according to a conventional acquisition method.
Figure 8:
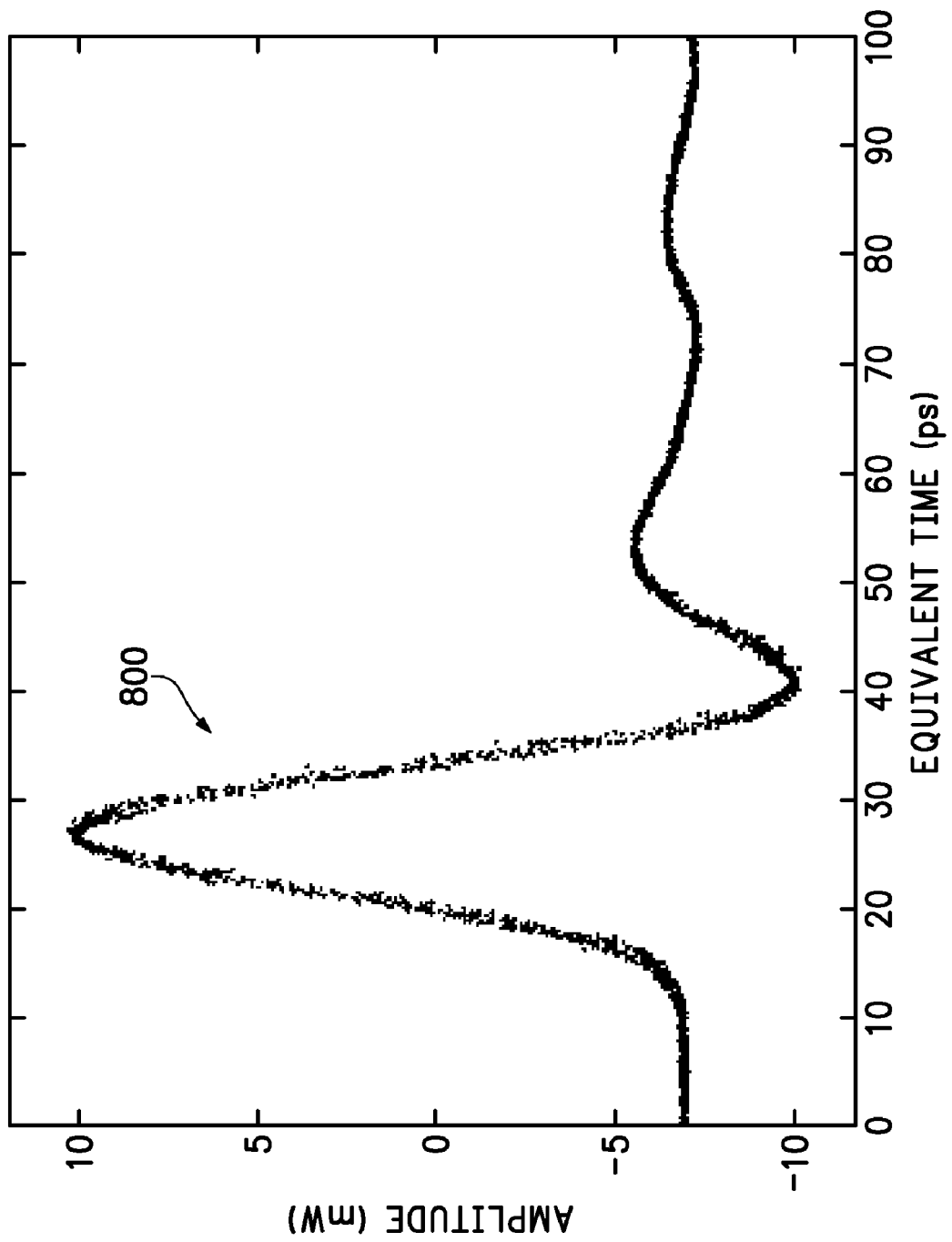
FIG. 8 illustrates a waveform of an optical impulse signal after compensating for the jitter of the oscilloscope in accordance with the present invention.

The timestamps may also be used to compensate the oscilloscope's intrinsic jitter as follows: Referring to FIG. 6, (1)

the jitter spurs are distinguished from the broadband jitter floor 610 because they exceed a threshold 615 as described in U.S. Pat. No. 6,832,172 to Ward et al., (2) the spurs are removed from the spectrum, (3) the remaining jitter spectrum is brought back into the time-domain to produce a set of sample time corrections $\tau 0, \tau 1, \tau 2 \ldots$, and (4) rather than displaying the samples at equivalent times of 0, 25 fs, 50 fs . . . as shown in FIG. 7, the samples may be displayed at corrected equivalent times $0+\tau 0$, $25\text{ fs}+\tau 1$, $50\text{ fs}+\tau 2$ . . . as shown in FIG. 8. This results in a decrease of displayed random jitter from 700 fs RMS in FIG. 7 to 250 fs RMS in FIG. 8.

Returning to the divider in the trigger signal path, consider that the straightforward unwrapping technique relied on the implicit assumption that the sampling frequency was relatively constant. The divider made this so by allowing the pulsed laser source to dictate the sampling frequency. Without the divider, trigger edges may have collided with the oscilloscope's arming of the trigger circuit, resulting in a considerably less straightforward unwrapping algorithm. Accordingly, for simplicity and clarity, the divider was used in the above example.

A penalty of the present acquisition method is that the phase-noise of both the signal-under-test and the reference clock is aliased up to high frequencies, thereby apparently magnifying the phase-noise of both signals. For example, if the reference clock in the example above included a low-frequency jitter signal with a period of 40 ms, it would be sampled with each of the 4,000 samples over the 40 ms of acquisition time and thus appear as a 100 ps oscillation on the display, apparently magnified to 10 GHz. Accordingly, for the highest fidelity measurements it is desirable that the reference clock have very low phase-noise.

In order to minimize the abovementioned penalty, rather than developing an ideal phase ramp with a straight line approximation, an alternative ideal phase ramp may be developed which tracks the low-frequency phase-noise of the oscillators by filtering the sampled phase ramp, e.g., with a boxcar filter. Jitter signals of longer time duration than the width of the boxcar are passed by the filter and built into the ideal phase ramp.

Thus the present invention provides a sequential equivalent-time oscilloscope that uses a reference clock which is asynchronous with the signal-under-test to compensate for the jitter of the oscilloscope. The present invention further provides an indication of the absolute jitter of the signal-under-test.

What is claimed is:

1. A sequential equivalent-time sampling oscilloscope comprising: a first input for receiving a signal-under-test; a second input for receiving a trigger signal, the trigger signal being synchronous with the signal-under-test; a third input for receiving a reference clock, the reference clock being asynchronous with the signal-under-test; circuitry for simultaneously acquiring samples of the signal-under-test and samples of the reference clock in response to the trigger signal; circuitry for calculating sampled phases from the samples of the reference clock; circuitry for unwrapping the sampled phases into a sampled phase ramp; circuitry for generating an ideal phase ramp from the sampled phase ramp; and circuitry for subtracting the sampled phase ramp from the ideal phase ramp in order to calculate timestamps from the samples of the reference clock.

2. The oscilloscope of claim 1 further comprising circuitry for generating the equivalent-time waveform of the signal-under-test from the timestamps.

3. The oscilloscope of claim 1 further comprising circuitry for determining the jitter of the signal-under-test from the timestamps relative to the reference clock.

4. A method of sequential equivalent-time sampling comprising:
   simultaneously acquiring samples of a signal-under-test and samples of a reference clock in response to a trigger signal, the trigger signal being synchronous with the signal-under-test, and the reference clock being asynchronous with the signal-under-test;
   calculating sampled phases from the samples of the reference clock;
   unwrapping the sampled phases into a sampled phase ramp;
   generating an ideal phase ramp from the sampled phase ramp; and
   subtracting the sampled phase ramp from the ideal phase ramp in order to calculate timestamps from the samples of the reference clock.

5. The method of claim 4 further comprising the step of generating the equivalent-time waveform of the signal-under-test from the timestamps.

6. The method of claim 4 further comprising the step of determining the jitter of the signal-under-test from the timestamps relative to the reference clock.

7. A sequential equivalent-time sampling oscilloscope comprising:
   means for receiving a signal-under-test;
   means for receiving a trigger signal, the trigger signal being synchronous with the signal-under-test;
   means for receiving a reference clock, the reference clock being asynchronous with the signal-under-test;
   means for simultaneously acquiring samples of the signal-under-test and samples of the reference clock in response to the trigger signal;
   means for calculating sampled phases from the samples of the reference clock;
   means for unwrapping the sampled phases into a sampled phase ramp;
   means for generating an ideal phase ramp from the sampled phase ramp; and
   means for subtracting the sampled phase ramp from the ideal phase ramp in order to calculate timestamps from the samples of the reference clock.

8. The oscilloscope of claim 7 further comprising means for generating the equivalent-time waveform of the signal-under-test from the timestamps.

9. The oscilloscope of claim 7 further comprising means for determining the jitter of the signal-under-test from the timestamps relative to the reference clock.

* * * * *